(12) United States Patent
Moldsvor (10) Patent No.: US 8,941,518 B2
(45) Date of Patent: Jan. 27, 2015

(54) METHODS AND APPARATUS FOR CALIBRATING PIPELINE ANALOG-TO-DIGITAL CONVERTERS HAVING MULTIPLE CHANNELS

(71) Applicant: Hittite Microwave Corporation, Chelmsford, MA (US)

(72) Inventor: Oystein Moldsvor, Tiller (NO)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/766,363

(22) Filed: Feb. 13, 2013

(65) Prior Publication Data

US 2013/0207818 A1 Aug. 15, 2013

Related U.S. Application Data

(60) Provisional application No. 61/598,509, filed on Feb. 14, 2012.

(51) Int. Cl.
*H03M 1/10* (2006.01)
*H03M 1/06* (2006.01)
*H03M 1/16* (2006.01)
*H03M 1/44* (2006.01)

(52) U.S. Cl.
CPC .......... *H03M 1/1009* (2013.01); *H03M 1/033* (2013.01); *H03M 1/0678* (2013.01); *H03M 1/0695* (2013.01); *H03M 1/167* (2013.01); *H03M 1/44* (2013.01)
USPC ........................................ 341/120; 341/118

(58) Field of Classification Search
CPC ............ H03M 1/06; H03M 1/08; H03M 1/10
USPC .................................................. 341/118, 120
See application file for complete search history.

(56) References Cited

U.S. PATENT DOCUMENTS

| 5,047,772 | A | * | 9/1991 | Ribner ........................ 341/156 |
| 5,465,092 | A | | 11/1995 | Mayes et al. |
| 6,184,809 | B1 | | 2/2001 | Yu |
| 6,198,423 | B1 | | 3/2001 | Yu |
| 6,366,230 | B1 | | 4/2002 | Zhang et al. |
| 6,486,807 | B2 | | 11/2002 | Jonsson |
| 6,489,904 | B1 | | 12/2002 | Hisano |
| 6,563,445 | B1 | | 5/2003 | Sabouri |
| 6,567,025 | B2 | | 5/2003 | Schreier et al. |
| 6,700,403 | B1 | | 3/2004 | Dillon |
| 6,975,950 | B2 | | 12/2005 | Bardsley |

(Continued)

FOREIGN PATENT DOCUMENTS

WO 2011/051763 A1 5/2011

OTHER PUBLICATIONS

Taherzadeh-Sani et al., Digital Background Calibration of a 0.4-pJ/step 10-bit Pipelined ADC without PN Generator in 90-nm Digital CMOS, IEEE Asian Solid-State Circuits Conference Nov. 3-5, 2008, pp. 53-56.*

(Continued)

*Primary Examiner* — Howard Williams
(74) *Attorney, Agent, or Firm* — Knobbe Martens Olson & Bear LLP (57) ABSTRACT

Methods and apparatus are provided for calibrating stages in pipeline analog-to-digital converters (ADCs) having multiple channels.

20 Claims, 9 Drawing Sheets

(56) References Cited

U.S. PATENT DOCUMENTS

| | | | |
|---|---|---|---|
| 7,015,842 | B1 | 3/2006 | Gupta et al. |
| 7,107,175 | B2 | 9/2006 | Maloberti et al. |
| 7,126,508 | B2 | 10/2006 | Seki |
| 7,221,299 | B2 | 5/2007 | Bjornsen |
| 7,312,734 | B2 | 12/2007 | McNeill et al. |
| 7,495,596 | B2 | 2/2009 | Kim et al. |
| 7,551,114 | B2 | 6/2009 | Joy et al. |
| 7,573,417 | B2 | 8/2009 | Bailey et al. |
| 7,741,987 | B2 | 6/2010 | Yung et al. |
| 8,451,152 | B2 * | 5/2013 | Shi et al. ............... 341/118 |
| 2009/0201051 | A1 | 8/2009 | Ono et al. |
| 2012/0293348 | A1 * | 11/2012 | Snelgrove ............... 341/118 |

OTHER PUBLICATIONS

Ahmed, et al., "11-Bit 45 MS/s Pipelined ADC With Rapid Calibration of DAC Errors in a Multibit Pipeline Stage," IEEE Journal of Solid-State Circuits, IEEE Service Center, Piscataway, NJ, USA, vol. 40, No. 7, Jul. 2008, pp. 1626-1637, XP011229231, ISSN: 0018-9200.

Brooks, et al., "Background Calibration of Pipelined ADCs Via Decision Boundary Gap Estimation," IEEE Transactions on Circuits and Systems I: Regular Papers, IEEE, US, vol. 55, No. 10, Nov. 2008, pp. 2969-2979, XP011333304, ISSN: 1549-8328, DOI: 10.1109/TCSI.2008.925373.

International Search Report and Written Opinion for PCT/IB2013/000671, dated Jul. 18, 2013.

Hernes et al., "A 92.5mW 205MS/s 10b Pipeline IF ADC Implemented in 1.2V/3.3V 0.13mm CMOS," 2007 IEEE International Solid-State Ciruits Conference, Digest of Technical Papers, Feb. 14, 2007, pp. 462-463 and 615.

Sumanen et al., "A 10-bit 200-MS/s CMOS Parallel Pipeline A/D Converter," IEEE Journal of Solid-State Circuits, vol. 36, No. 7, Jul. 2001, pp. 1048-1055.

\* cited by examiner

METHODS AND APPARATUS FOR CALIBRATING PIPELINE ANALOG-TO-DIGITAL CONVERTERS HAVING MULTIPLE CHANNELS

CROSS REFERENCE TO RELATED APPLICATION

This application claims priority from U.S. Provisional Patent Application No. 61/598,509 filed on Feb. 14, 2012 entitled METHOD AND APPARATUS FOR DIGITAL CALIBRATION OF ANALOG-TO-DIGITAL CONVERTERS HAVING MULTIPLE CHANNELS, which is hereby incorporated by reference.

BACKGROUND

The present application generally relates to analog-to-digital conversion and, more particularly, to calibrating stages in pipeline analog-to-digital converters (ADCs) having multiple channels.

One efficient way to obtain a higher signal-to-noise ratio (SNR) in analog-to-digital conversion is to run two or more ADCs in parallel. The ADCs sample an input signal at the same instant, and their digital output data are summed. As discussed in PCT Publication No. WO 2011/018711 entitled ADC WITH ENHANCED AND/OR ADJUSTABLE ACCURACY, it has been shown that having two parallel ADCs can result in a 3 dB increase in SNR if the errors in the two ADCs are uncorrelated.

Calibration of ADCs is needed to obtain high accuracy and linearity. Offset errors, capacitor mismatch errors, and gain errors result in integral nonlinearity (INL) and differential nonlinearity (DNL) errors in ADCs. Various embodiments disclosed herein are directed to techniques for identifying and quantifying these errors for purposes of calibration. The techniques can be applied to an ADC architecture with two or more pipelined ADCs connected in parallel.

BRIEF SUMMARY OF THE DISCLOSURE

In accordance with one or more embodiments, a method is provided for determining transition step size in a pipeline analog-to-digital converter for use in calibration. The pipeline analog-to-digital converter has at least a first channel and a second channel connected in parallel for sampling an input analog signal, each channel including one or more serially connected analog-to-digital pipeline stages and a back-end analog-to-digital converter receiving an output voltage from a pipeline stage. The method includes the steps of: (a) selecting a given output code or a range of output codes from the second channel corresponding to a particular input voltage of the input analog signal, said given output code or range of output codes selected to be within a transition band of a comparator in a first pipeline stage of the first channel; (b) each time the given output code or an output code within the range of output codes from the second channel is detected during sampling of the input analog signal, identifying a corresponding output code from the back-end analog-to-digital converter of the first channel and a corresponding output code from the first pipeline stage of the first channel; (c) determining whether the output codes of the back-end analog-to-digital converter correspond to either a first output code or a second output code from the first pipeline stage of the first channel; (d) performing a statistical analysis of output codes from the back-end analog-to-digital converter of the first channel corresponding to the first and second output codes from the first pipeline stage of the first channel; and (e) determining a transition step size based on the difference between the output codes from the back-end analog-to-digital converter of the first channel corresponding to the first and second output codes from the first pipeline stage of the first channel.

In accordance with one or more further embodiments, a method is provided for calibrating a pipeline analog-to-digital converter. The pipeline analog-to-digital converter has at least a first channel and a second channel connected in parallel for sampling an input analog signal, each channel including one or more serially connected analog-to-digital pipeline stages and a back-end analog-to-digital converter receiving an output voltage from a pipeline stage. The method includes the steps of: (a) using output data from one of the channels to generate a statistical estimate of the input analog signal voltage; (b) using the statistical estimate of the input analog signal voltage to estimate errors in transfer characteristics of pipeline stages in one or more other channels; and (c) using the estimated errors in a calibration routine to remove the estimated errors in the one or more other channels.

In accordance with one or more further embodiments, a method is provided for determining stage gain error for use in calibration of a pipeline analog-to-digital converter. The pipeline analog-to-digital converter has at least a first channel and a second channel connected in parallel for sampling an input analog signal, each channel including one or more serially connected analog-to-digital pipeline stages and a back-end analog-to-digital converter. The method includes the steps of: (a) selecting two given output codes from the second channel corresponding to particular input voltages of the input analog signal; (b) each time either given output code from the second channel is detected during sampling of the input analog signal, identifying a corresponding output code from the back-end analog-to-digital converter of the first channel and a corresponding output voltage from the analog-to-digital pipeline stage of the first channel; (c) determining average voltage values corresponding to the two given output codes from the second channel, and determining average output voltage values from the analog-to-digital stage of the first channel corresponding to the output codes from the back-end analog-to-digital converter of the first channel; and (d) determining an analog-to-digital converter transfer slope based on the difference between the average voltage values corresponding to the two given output codes from the second channel and the difference between the average output voltage values from the analog-to-digital stage of the first channel corresponding to the output codes from the back-end analog-to-digital converter of the first channel.

In accordance with one or more further embodiments, a method is provided for determining stage gain error in a pipeline analog-to-digital converter for use in calibration. The pipeline analog-to-digital converter has at least one channel including one or more serially connected analog-to-digital pipeline stages and a back-end analog-to-digital converter. The method includes the steps of: (a) generating a digital output word of the analog-to-digital converter by combining data from the back-end analog-to-digital converter and a serially connected analog-to-digital pipeline stage using coefficients representing relative weight of the data; (b) measuring the frequency of occurrence for codes in the analog-to-digital converter output; (c) finding transition steps where the serially connected analog-to-digital pipeline stage changes value; and (d) adjusting coefficients representing the relative weight of data until the data has certain given statistical properties across the range of codes around the transition step.

DETAILED DESCRIPTION

Figure 1:
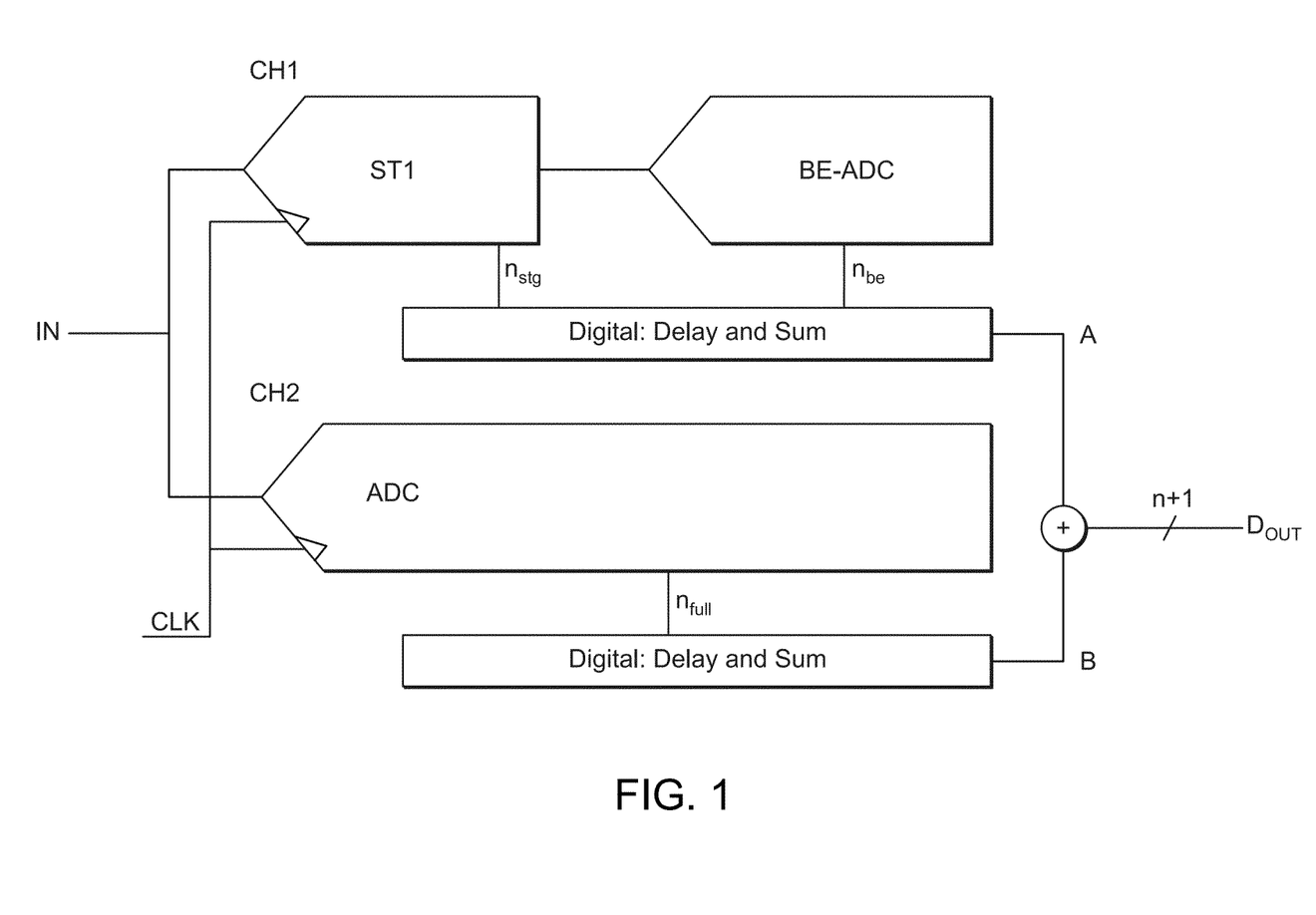
FIG. 1 schematically illustrates a representative pipeline ADC with two ADC channels used to illustrate calibration techniques in accordance with one or more embodiments.

FIG. 1 schematically shows a representative ADC provided to illustrate calibration techniques in accordance with various embodiments. The ADC comprises two equal ADCs called channels CH1 and CH2, which are connected in parallel. While two channels are shown in this figure, it should be understood that the techniques described herein can also be used in ADCs with more than two channels.

The channels CH1 and CH2 are the same, but are drawn differently in FIG. 1 for purposes of illustration. Specifically, channel CH1 is drawn to explicitly show the first stage ST1 and the back-end ADC, BE-ADC, which are also present in CH2, though not shown.

The two channels CH1 and CH2 sample the same input signal at the same instant. Hence the output values A and B will be equal except for noise, gain, and offset errors. When summing A and B, a new output word with higher resolution is obtained since the white noise is averaged between the two channels. The digital output values of CH1 and CH2 are independent quantized values of the input signal. Or expressed in statistical terms one can say that the output values A and B are statistical estimates of the common analog input voltage.

Figure 2:
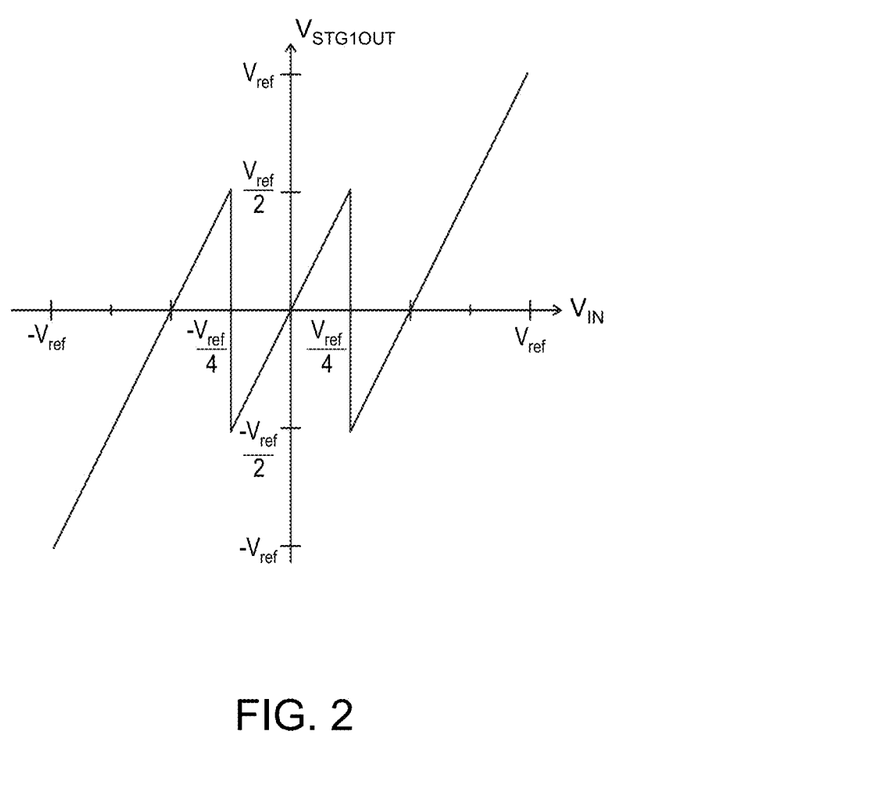
FIG. 2 is a graph illustrating a representative transfer function of a 1.5 bit pipeline stage in the FIG. 1 ADC.

For purposes of illustration, the stage ST1 in channel CH1 is a 1.5 bit pipeline stage. The transfer function of the stage is shown in FIG. 2. The Y-axis in the figure represents the stage output. With an ideal BE-ADC, the digital output from the BE-ADC will a digital representation of the ST1 stage output.

The BE-ADC samples the output of the stage ST1, represented by the Y-axis of FIG. 2 with a certain number of bits resolution. The digital output of stage ST1 is 00 when the input signal is smaller than −Vref/4, 01 around zero input, and 10 when the input is higher than Vref/4. A stage residual voltage is passed by ST1 to the BE-ADC. A digital delay and sum element combines the digital output of the BE-ADC and the digital output of ST1 to create the channel output, A in FIG. 1.

In order to generate the ADC output, the output codes from ST1 are combined with the results from the BE-ADC to form a straight ADC transfer curve. This can be explained the following way even though actual implementations may be varied:

For output code 00 from stage ST1, the values from the BE-ADC are reduced by an amount of least significant bits (LSBs) equal to the transition step at −Vref/4. For code 01, the codes can be used directly from the BE-ADC. For code 10, the value is increased by an amount of LSBs equal to the transition step at +Vref/4. This means that digital data from ST1 are combined with the BE-ADC data according to the relative weight of the data from ST1 and the BE-ADC respectively to generate the ADC output code.

For an ordinary uncalibrated pipeline ADC, the assumption is that the gain of stage ST1 is exactly equal to 2, and hence the transition step should be exactly Vref (from +Vref/2 to −Vref/2). In other words, the relative weight of digital data from ST1 is two times the weight of data from the BE-ADC. Because of capacitor mismatch errors, insufficient amplifier gain, or offset errors, the transition step may have an actual value different from the ideal value. This will result in a non-ideal transfer curve as shown, by way of example, in FIG. 3.

Most prior art calibration schemes involve finding the size of the transition step or related values with a close mathematical relationship to the step size. Hence, if the size of the transition step can be measured, it can be used in most known calibration schemes. Known methods of measuring the size of the transition step can require additional extra analog circuitry. This significantly increases the analog complexity and limits the maximum operation speed of the circuitry.

Additionally, the values measured in the calibration cycles, often involving separate hardware, must be equal to the values obtained during normal operation. This is difficult to achieve and introduces an additional difficult verification step in an already challenging design cycle.

Finding Transition Step Size Errors

Figure 4:
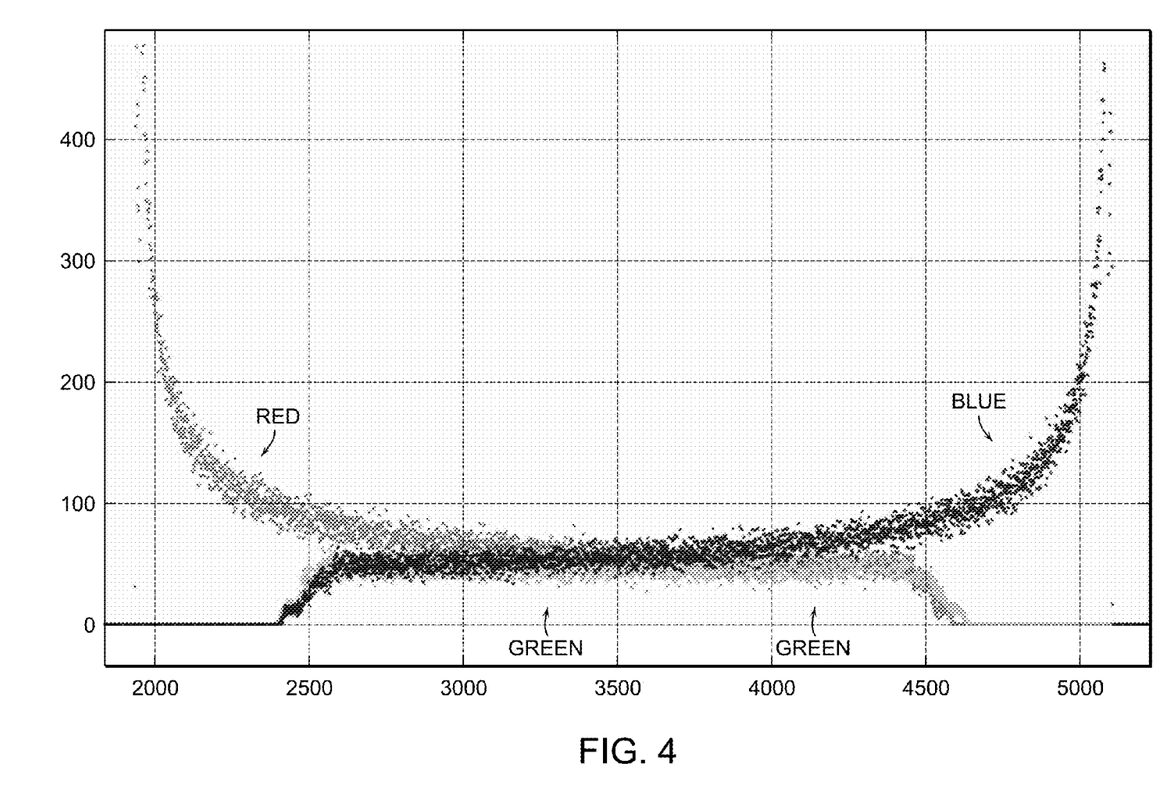
FIG. 4 is a histogram of the BE-ADC output of an ADC with a sine wave input.

The output of the BE-ADC would appear as shown in the histogram of FIG. 4 if a sine wave input is applied to the ADC. The RED points correspond to data when ST1 has code 00, the green points correspond to code 01, and the blue points correspond to code 10. If the histogram is reconstructed taking the codes from ST1 into account, the histogram will look as shown in FIG. 5.

Figure 5:
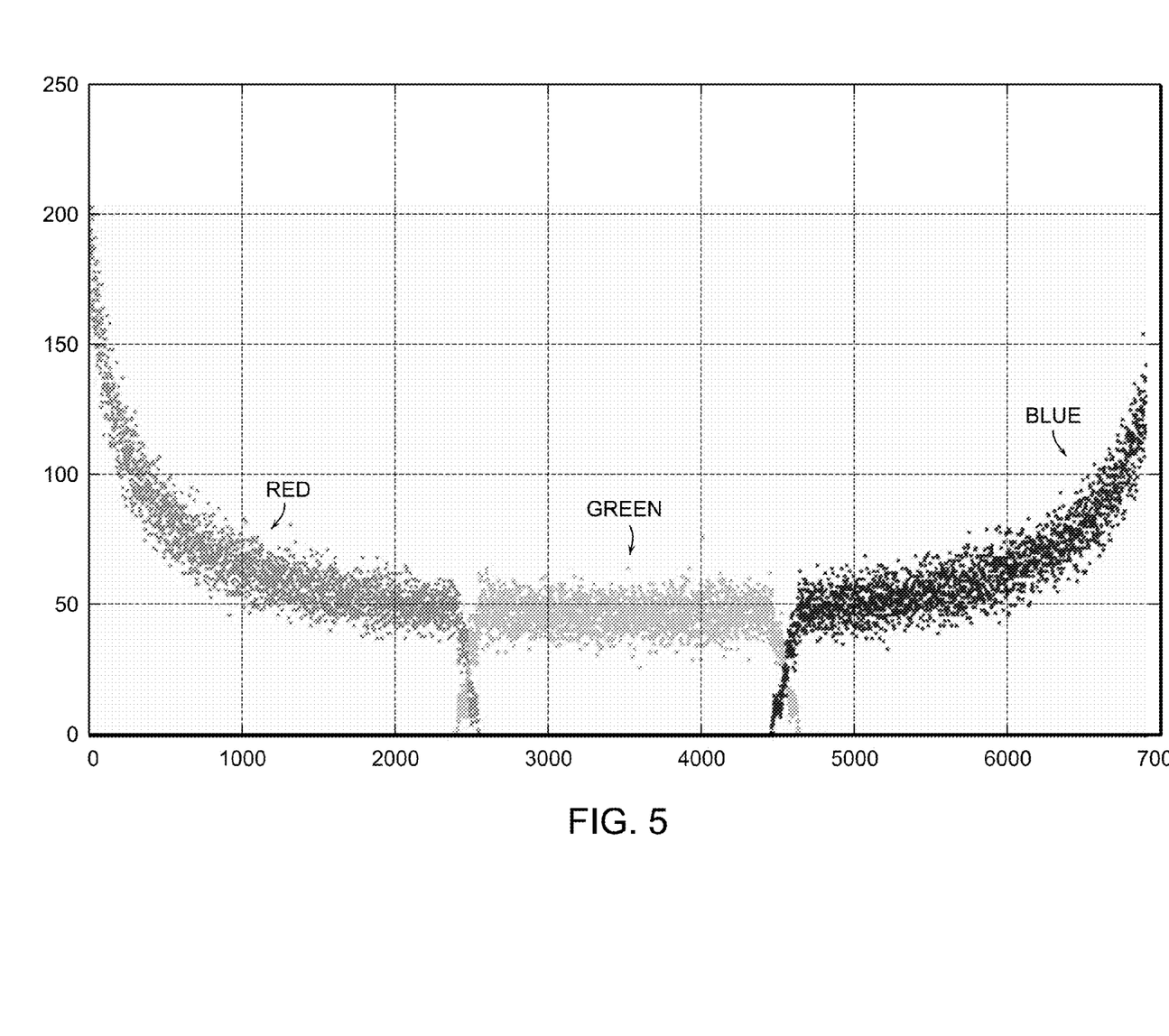
FIG. 5 is a histogram of the full ADC output.

In FIG. 5, the red points have been moved to the left (by being reduced in value), and the blue points have been moved to the right (by being increased in value). If the INL and DNL of the ADC are perfect, the point density in the histogram should be smooth across the code range of the histogram. It is apparent from the figure that if the values used for the transition steps are too high, the red and blue segments will be moved too far to the sides. And for big errors, missing codes would arise in the histogram and therefore the ADC would have missing codes and gross INL errors. If the value used for the transition step is too low, codes would be congested around the transition steps, also resulting in gross INL errors.

According to one or more embodiments, the average total code density in an area around the transition steps of the histogram in FIG. 5 can be monitored and calculated for various values of the transition steps. As described in the paragraph above, the linearity errors of the reconstructed wave would be smallest when the code distribution is as even as possible. A possible algorithm would be to use the histogram of FIG. 5 and calculate the average number of hits per code for a segment right below a transition step, right above the transition step, and in the middle of the transition step. The histogram shown in FIG. 5 is per definition a graph showing the frequency of occurrence on the Y-axis versus the ADC output code on the X-axis. The algorithm can be explained as follows for finding the transition step, or in other words, the relative weight of the ST1 digital code used when recombining data from ST1 and the BE-ADC into the output digital word. This explanation is provided only for illustrating the general principle of determining the transition step as several alternatives exist for the actual implementation.

Assume that the transition step around code 2500 is to be determined. Then find the average of the frequency of occurrence from code 2000 to 2100 (red points), or another suitable code range. From FIG. 5 one could see that in this particular case the average would be right above 50. Then find the average of the frequency of occurrence from code 2900 to code 3000 (green points), or another suitable code range. This would in the case shown in FIG. 5 be right below 50. Then the average between these two averages could be taken, resulting in a value close to 50. This value will then represent the average of frequency of occurrence around but not including the transition band.

Then the average of the codes within the transition band (approximately from code 2400 to code 2600) including both red and green points should be taken. The transition step used in the digital recombination generating the digital output word based on ST1 and BE-ADC data should then be adjusted until the average within the transition band is equal to the average around but not including the transition band. This is equivalent to finding the transition step value that gives the total frequency of occurrence around the transition step (including red and green points) as linear or smooth as possible. One could see that if the value of the transition step is too low, the red curves would not be moved sufficiently to the left, and the frequency of occurrence will increase in the transition band when summing the red and green points. This will make the average within the transition band too high. The opposite would happen when the transition step is too high.

This algorithm however, would require certain properties of the input signal to converge. The input signal should have properties such that the output histogram is a smooth curve with a predictable frequency of occurrence below, in, and above the transition band. It will not converge for an arbitrary input signal. Therefore a further refinement of the technique can be made with a parallel ADC CH2 that can be used to estimate the properties of the common input signal In accordance with one or more embodiments, a method is provided to precisely find the size of the transition step without use of extra hardware. The size of the transition step can be found by analyzing the output data from stage ST1, the BE-ADC, and channel CH2 based on an arbitrary input signal. The use of an arbitrary input signal is made possible since the CH2 digital output is a statistical estimate of the analog input signal at every sampling instant. Hence this estimate can be used in various schemes to estimate error voltages inside CH1 by being able to estimate the ideal voltage or signal for a specific analog input voltage. For the particular scheme described here, the input signal should have sufficient amplitude at least in periods of the calibration cycle, to span the complete input signal range of the ADC, or all comparator levels in the first stage, ST1. This can be ensured if, e.g., part of the calibration is done during the production test.

Another feature of the histogram to consider in order to explain the operation of the algorithm is the width of the transition bands. If the comparators at −Vref/4 and +Vref/4 were ideal, the transition would happen at one specific code. However, due to noise and other random errors sources in the comparators at −Vref/4 and +Vref/4, the actual transitions vary each time the ADC samples. This results in the transition bands between red and green and between green and blue points. This effect can be illustrated in the stage transfer curve as shown in FIG. 6.

The comparator random error in itself is not problematic as the digital correction logic uses the redundancy designed into the pipeline stage architecture to resolve these errors. This random behavior can be used in an alternative way to determine the step size as explained below.

Figure 6:
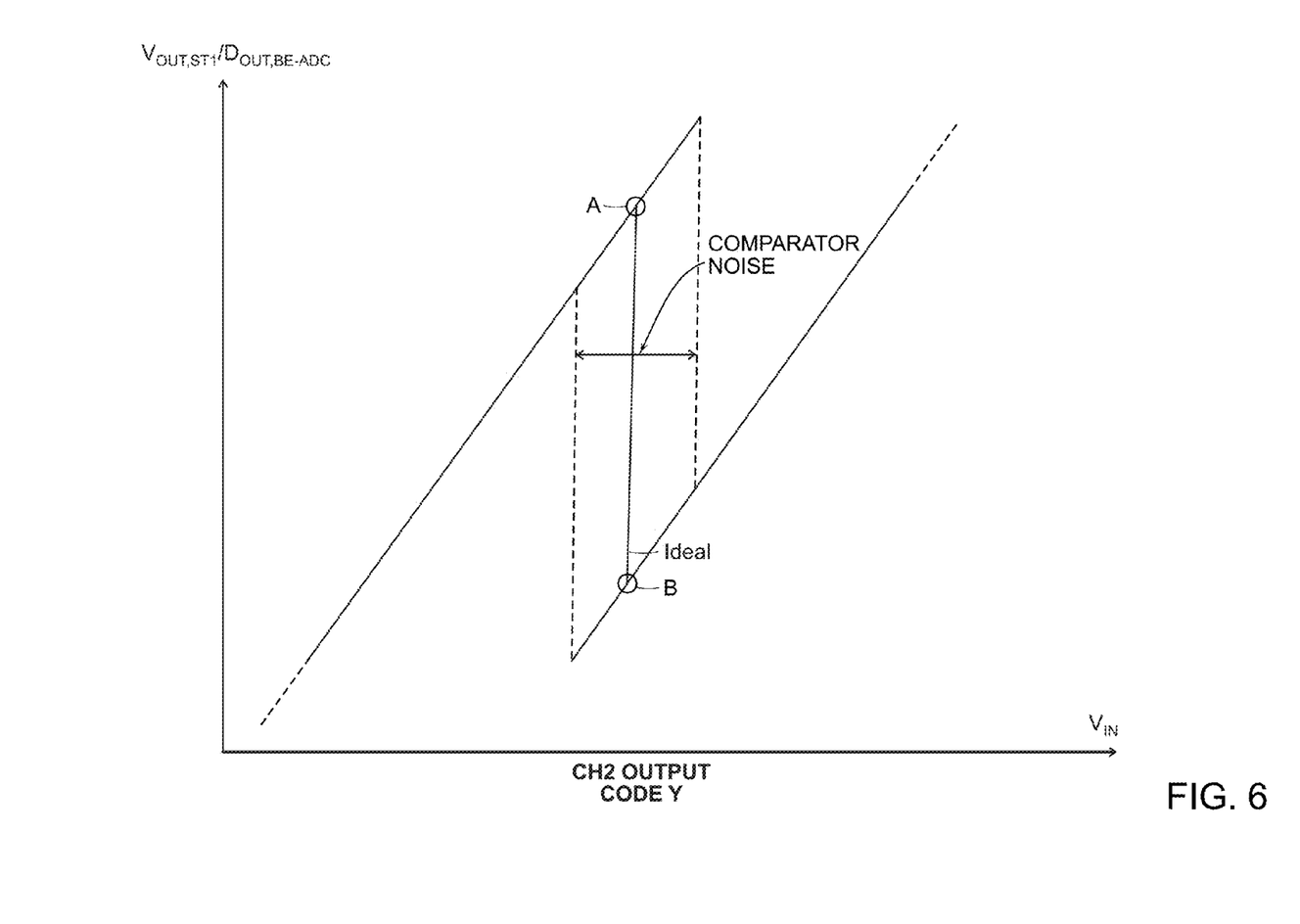
FIG. 6 is a graph illustrating a representative stage transfer curve at one comparator level with a noisy threshold voltage.

One known approach for calibration is to disconnect the analog input from the ADC and use additional hardware under digital control to force the stage to produce output voltages at points A and B in FIG. 6. These voltages are then measured with the BE-ADC, which is equivalent to determining the Y-axis value of point A and B in the figure. The step size is then calculated as the difference in Y-axis value of point A and point B.

Figure 7:
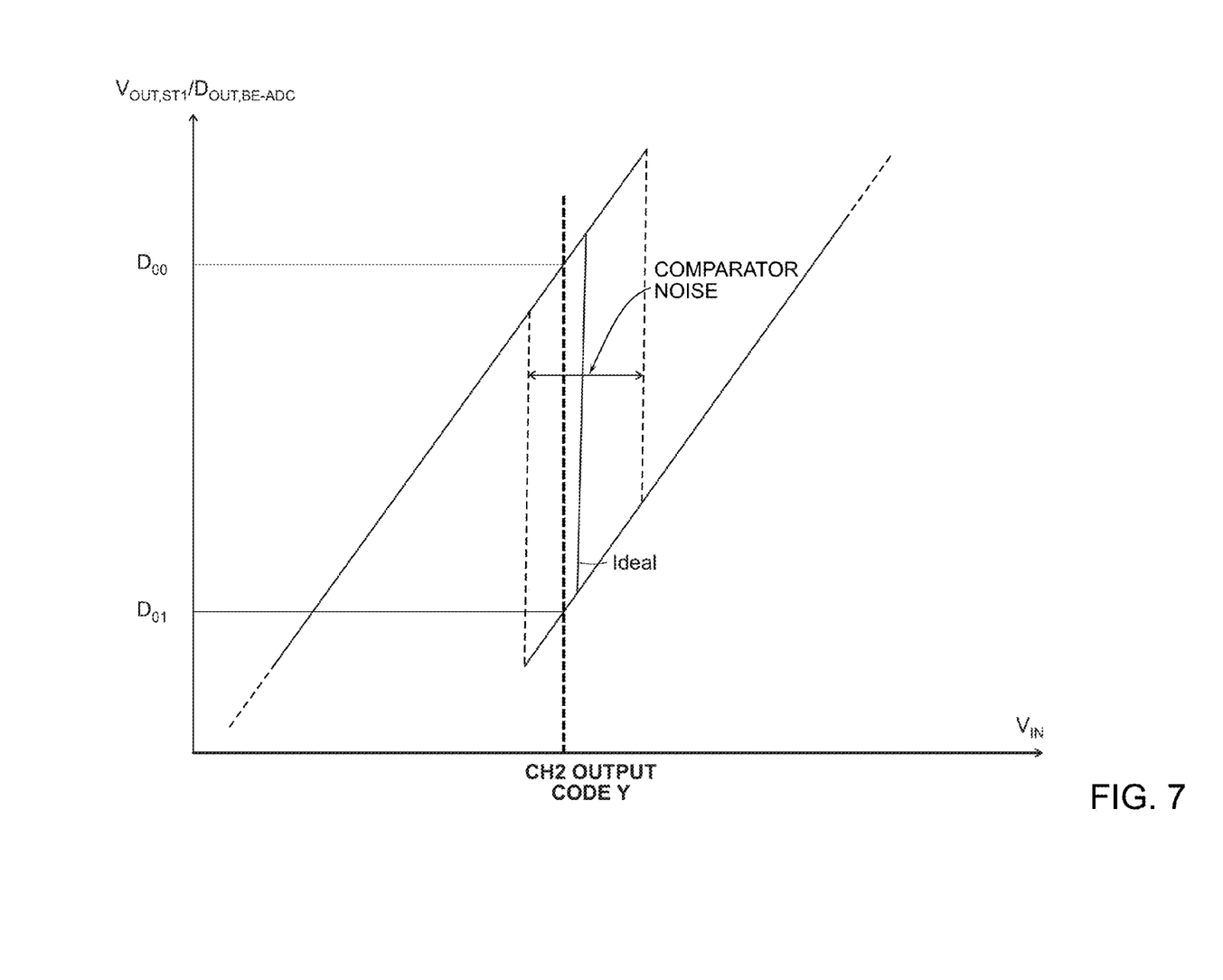
FIG. 7 is a graph illustrating the stage transfer curve of FIG. 6 marked with a selected output code.

With methods in accordance with various embodiments, no extra analog hardware is used. Instead, a certain output code (Code Y) from CH2 is selected. Alternatively, a small range of output codes around Code Y can be used. The specific output code from CH2 corresponds to a specific input voltage of CH1 as both channels sample the same input at the same time. This corresponds to selecting CH1 samples for a given input signal voltage. In statistical terms this can be denoted as using the CH2 output as an estimate of the ADC input voltage and selecting samples through CH1 based on the input voltage estimate. Code Y is selected to be within the transition band of one of the comparators in ST1 as shown in FIG. 7. Every time Code Y appears, the corresponding output code from the BE-ADC is observed. Based on these occurrences, one can build histograms of the BE-ADC output code, or find other suitable methods to analyze the data.

Depending on the decision in the comparator of ST1, the output code will be either at the top or bottom intersection point. The corresponding BE-ADC output codes can be labeled D00 and D01 as shown in the figure.

The transition step size, StS, can then be calculated as StS=D00−D01. As only one single output code from the CH2 ADC is used, linearity errors, offset errors, and gain error in the CH2 ADC are not an issue and will not impact the result. The accuracy of the estimate of the transition step size, StS, will be dependent on various random noise sources. But the noise can be averaged out by increasing the number of samples used in the calculation. There will therefore be a tradeoff between the time required to capture the samples and the obtained accuracy. It is also possible to calculate the step size by taking into account all the samples in the transition band doing a similar operation on multiple output codes from CH2. This can allow for faster convergence times of the algorithm since the total number of data points will increase significantly, resulting in better averaging of random noise.

Finding Stage Gain Errors

Figure 3:
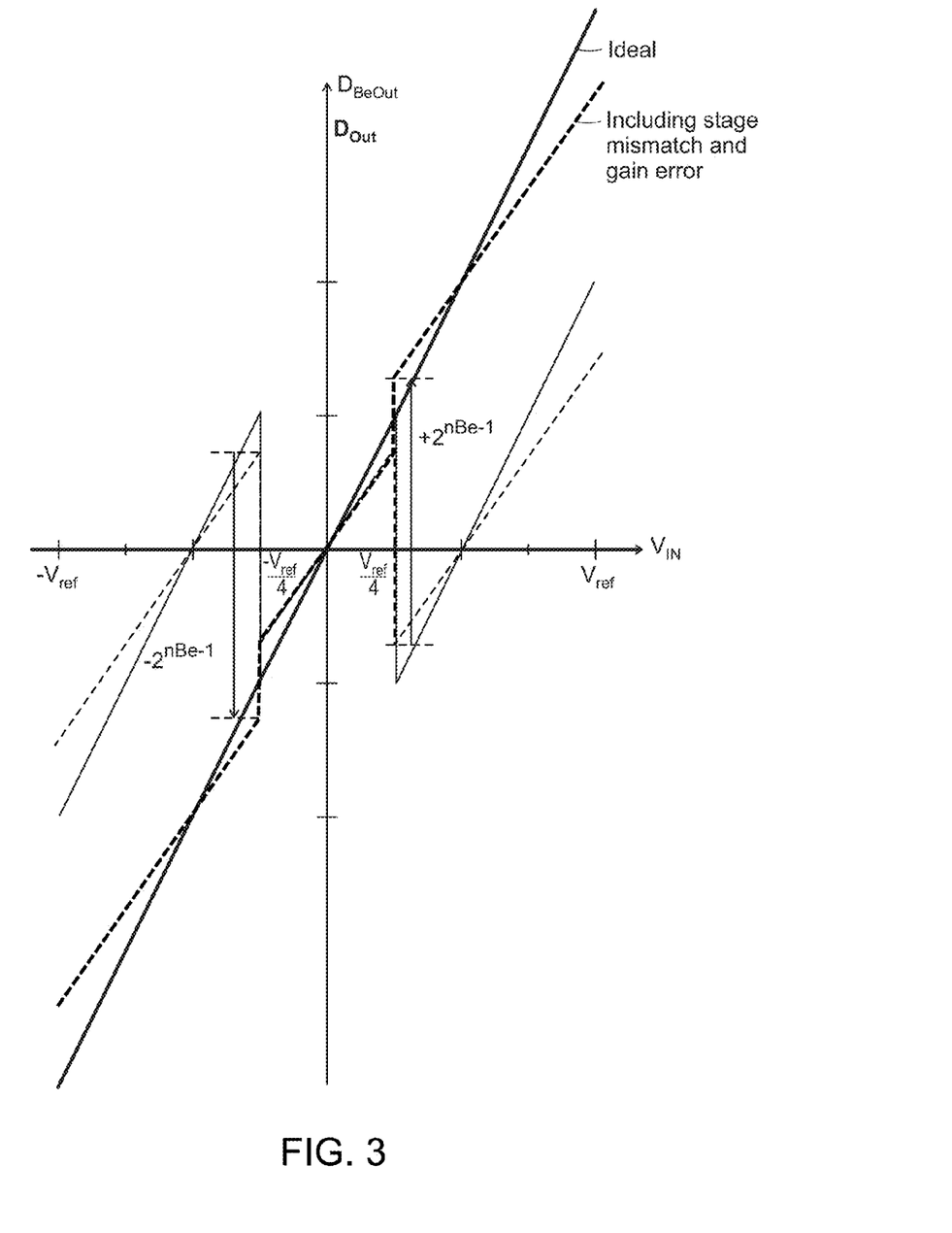
FIG. 3 is a graph illustrating representative ideal and non-ideal ADC transfer curves.
Figure 8:
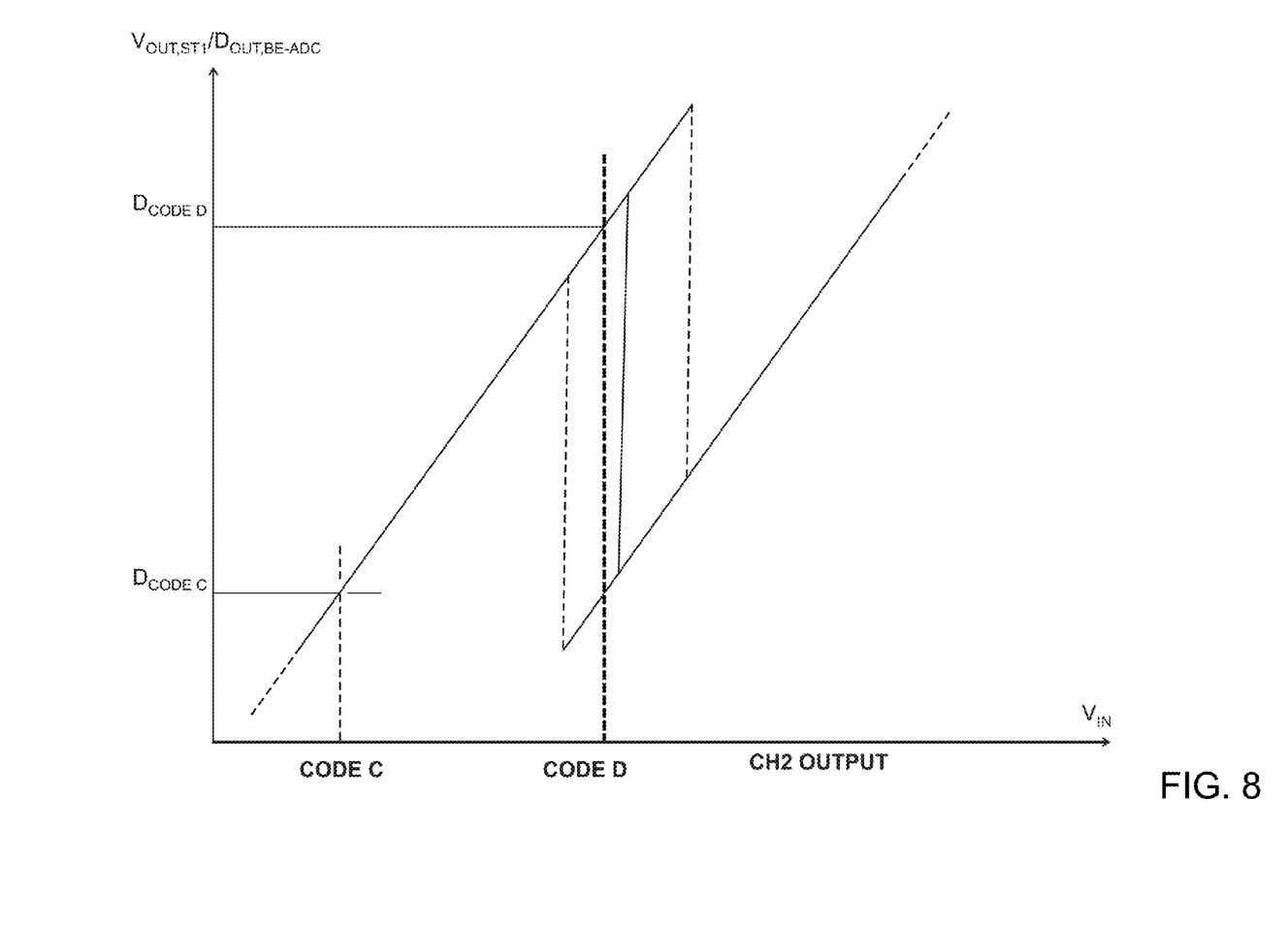
FIG. 8 is a graph illustrating the stage transfer curve of FIG. 6 marked with two selected output codes.

In a similar manner, one can determine gain errors in each segment of the ST1 transfer curve. As shown in FIG. 3, the slope in each of the segments corresponding to output code 00, 01, and 10 can be different. By defining two CH2 output codes (Code C and D) within the segment as shown in FIG. 8, and collecting BE-ADC histograms for these two codes separately, the slope within the segment corresponds to the distance between the two resulting BE-ADC codes, $D_{CODE}$ D and $D_{CODE}$ C, and the distance between Code C and Code D. In this case, linearity errors in CH2 will impact the measurements. However, it is possible to define more than two codes to obtain several measurements for different sections of the CH2 ADC. The higher number of measurements can be used to calculate a better estimate for the actual slope.

It is also possible to place both Code C and Code D within the transition band and hence calculate the slope difference in two segments at the same time. This would allow comparing the slopes without being dependent on the linearity errors in the CH2 ADC.

Alternative Methods For Step Size Estimation

An alternative method for analyzing the characteristics to find, e.g., the transition step size, is now discussed. Instead of analyzing data from the BE-ADC for only one output code of CH2, the same operation can be repeated for every CH2 output code. The quasi-code below shows an example algorithm for such an analysis. Assume that there are $2^N$ codes in each of the two ADCs of CH1 and CH2 where N is the number of bits in the ADCs. Assume further that a sample size of M is captured, and that M is sufficiently large and the input signal to the ADC is such that all N output codes are hit several times in both CH1 and CH2. The exemplary algorithm is as follows:

```
For I = 1 to 2^N
    Find the sample number (in the vector 1 to M) of all samples hitting
    code I of CH2
    Use a statistical method to find a representation of all BE-ADC
samples for the same sample numbers
    Store this statistical representation in the index I of vector SBE-ADC
End
```

In accordance with one or more embodiments, the statistical method could, e.g., be the mean or median of the BE-ADC samples to define the expected output value of BE-ADC for a given output code of CH2. As the output of CH2 is an estimate of the common input voltage to the two ADCs CH1 and CH2, the algorithm above goes through the input range of the ADC and generates an estimate of the BE-ADC output code as function of the ADC input voltage. The values in vector SBE-ADC will therefore represent the expected value of the BE-ADC output code defined by the statistical method selected and the index of the vector will represent the CH2 output code. The CH2 output code would be an ideal representation to the ADC input voltage in case CH2 was an ideal ADC.

Figure 9:
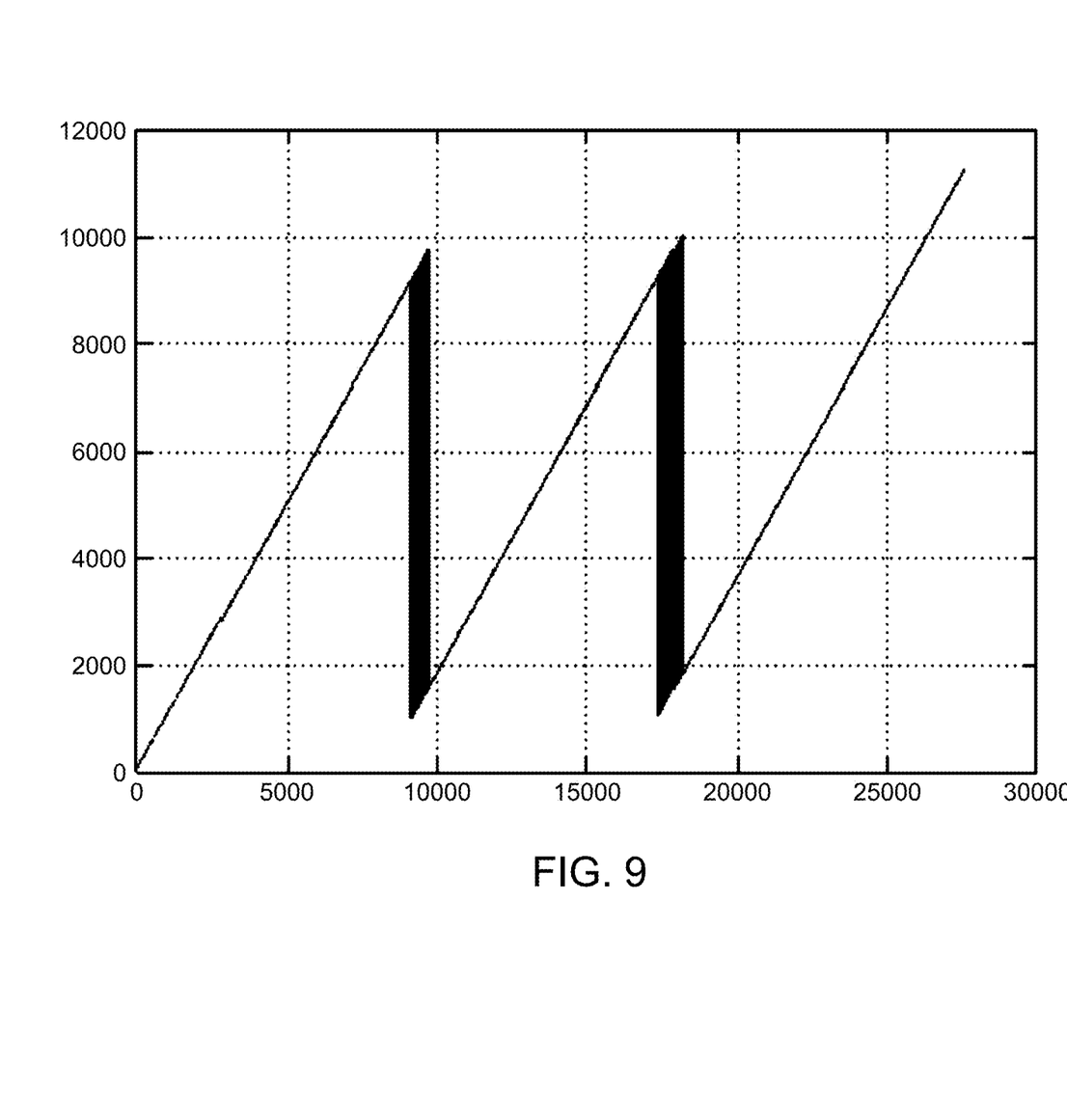
FIG. 9 is a graph illustrating an exemplary BE-ADC plot.

An example plot of BE-ADC is shown in FIG. 9. Comparing FIG. 9 with FIG. 2 it can be seen that the algorithm can be used to generate an estimate of the ST1 residue plot with an arbitrary input signal.

Based on the SBE-ADC it will be possible to estimate important characteristics of the residue plot like transition step size and gain within each segment using various statistical methods. These characteristics can be used to compensate for errors in ST1.

In general terms, all the methods described above can be explained as using a parallel ADC channel to determine an estimate of the common input signal voltage, using this estimate to find expected signal values internal inside the CH1 ADC, and estimate error terms or correction coefficients based on the difference between the estimate and measured internal signal values.

A similar approach can be used also for other stages in the CH1 ADC by finding the proper CH2 ADC codes to observe the BE-ADC code. Note that the BE-ADC will be different in this case as the BE-ADC contains only the stages after the stage in calibration. It is also possible to switch ADCs and calibrate CH2 instead of CH1 using the same methodology. In this way, it is possible to fully calibrate all stages in all channels of an ADC where there are at least two ADC channels quantizing the same input signal in parallel.

In order to calibrate all transition steps in the first stage of an ADC, the input signal should at least span all the comparator thresholds in the stage. This may be handled in several ways, including the following:

1. Background calibration (during normal operation)—Since the method does not require any special analog mode for operation, it can be run during normal operation of the ADC without any interruption of operation.

2. Dynamic convergence time—The method can, in some embodiments, require that a certain number of hits for D00 and D01 (or whatever codes are defined in the equation) must be collected before a calculation is made in order to get sufficiently low noise in the measurements. In this case, the algorithm will wait until the input signal has spanned the input range sufficiently before the calibration is performed.

3. Production test calibration—Most of the error effect is dependent on random mismatches of a certain chip. These will not vary significantly over supply and temperature. The amplifier (OTA) gain is the parameter with the biggest variation. The OTA gain will impact the slope of the transfer curve. However, the slope change will be equal (or at least very similar) in each segment, and it will be strongly correlated between each stage.

4. Background gain calibration only—The slope can be monitored in several stages and a global adjustment to the gain factors is made based on a gain change found from a stage further down the pipeline change. In these stages, due to the upfront stage gain, one will very soon have a significant input voltage swing even with a small input signal.

It is also possible to monitor amplifier gain changes by monitoring the transition steps. If all transition steps during operation change with the same magnitude in the same direction, one could conclude that the OTA gain has changed, and adjust all gain coefficients accordingly.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments.

Additionally, elements and components described herein may be further divided into additional components or joined together to form fewer components for performing the same functions.

Accordingly, the foregoing description and attached drawings are by way of example only, and are not intended to be limiting.

What is claimed is:

1. In a pipeline analog-to-digital converter having at least a first channel and a second channel connected in parallel for sampling an input analog signal, each channel including one or more serially connected analog-to-digital pipeline stages and a back-end analog-to-digital converter receiving an output voltage from a pipeline stage, a method for determining transition step size for use in calibration comprising the steps of:

(a) selecting a given output code or a range of output codes from the second channel corresponding to a particular input voltage of the input analog signal, said given output code or range of output codes selected to be within a transition band of a comparator in a first pipeline stage of the first channel;

(b) each time the given output code or an output code within the range of output codes from the second channel is detected during sampling of the input analog signal, identifying a corresponding output code from the back-end analog-to-digital converter of the first channel and a corresponding output code from the first pipeline stage of the first channel;

(c) determining whether the output codes of the back-end analog-to-digital converter of the first channel correspond to either a first output code or a second output code from the first pipeline stage of the first channel;

(d) performing a statistical analysis of output codes from the back-end analog-to-digital converter of the first channel corresponding to the first and second output codes from the first pipeline stage of the first channel; and (e) determining a transition step size based on the difference between the output codes from the back-end analog-to-digital converter of the first channel corresponding to the first and second output codes from the first pipeline stage of the first channel.

2. The method of claim 1, wherein the transition step size is used to calibrate the pipeline analog-to-digital converter.

3. The method of claim 1, wherein performing a statistical analysis of output codes comprises calculating mean or median values of code density of the output codes.

4. The method of claim 1, wherein the one or more serially connected analog-to-digital pipeline stages comprise a plurality of pipeline stages, and further comprising determining a transition step size for each of said pipeline stages.

5. The method of claim 1, further comprising simultaneously determining a transition step size of a pipeline stage of the second channel.

6. A method of analog-to-digital converter calibration, the method comprising:
receiving an analog input voltage as an input to a pipeline analog-to-digital converter, wherein the pipeline analog-to-digital converter comprises a first channel and a second channel connected in parallel;
generating a first digital channel output by analog-to-digital conversion of the analog input voltage using the first channel, wherein generating the first digital channel output comprises:
generating a first digital stage output and a first analog residual voltage using a first pipeline stage of the first channel, the first pipeline stage comprising a plurality of comparators including a first comparator, wherein the first digital stage output is generated in part by comparing the analog input voltage to a first reference voltage using the first comparator of the first pipeline stage;
using a back-end analog-to-digital converter of the first channel, performing an analog-to-digital conversion of the analog residual voltage to generate a second digital stage output;
combining the first digital stage output and the second digital stage output to generate the first digital channel output;
generating a second digital channel output by analog-to-digital conversion of the analog input voltage using the second channel;
identifying an output code of the second digital channel output corresponding to a voltage level of the analog input voltage that is within a transition band of the first comparator of the first pipeline stage of the first channel;
during a calibration cycle, observing a code of the first digital stage output and a code of the second digital stage output of the first channel for each of a plurality of time instances in which the second digital channel output has the identified output code; and
determining a transition step size of the first pipeline stage of the first channel based on the observed codes of the first digital stage output and the observed codes of the second digital stage output.

7. The method of claim 6, further comprising determining whether each of the observed codes of the second digital stage output correspond to the first comparator having a first comparison result or to the first comparator having a second comparison result.

8. The method of claim 7, further comprising performing a statistical analysis on the observed codes of the second digital stage output.

9. The method of claim 8, wherein performing the statistical analysis comprises generating a histogram of the observed codes of the second digital stage output.

10. The method of claim 7, wherein determining the transition step size of the first pipeline stage comprises determining a difference between a first observed code of the second digital stage output corresponding to the first comparator having the first comparison result and a second observed code of the second digital stage output corresponding to the first comparator having the second comparison result.

11. The method of claim 6, wherein combining the first digital stage output and the second digital stage output to generate the first digital channel output comprises determining a weight of the first digital stage output relative to the second digital stage output based on the transition step size.

12. The method of claim 6, wherein generating the first digital stage output of the first pipeline stage comprises:
controlling the first digital stage output to a first code when the analog input voltage is less than the first reference voltage;
controlling the first digital stage output to a second code when the analog input voltage is greater than a second reference voltage; and
otherwise controlling the first digital stage output to a third code.

13. The method of claim 6, further comprising performing the calibration cycle during normal operation of the pipeline analog-to-digital converter.

14. The method of claim 6, further comprising performing the calibration cycle during production test of the pipeline analog-to-digital converter.

15. A pipeline analog-to-digital converter comprising:
a first channel configured to receive an analog input voltage and to generate a first digital channel output, wherein the first channel comprises:
a first pipeline stage configured to generate a first digital stage output and a first analog residual voltage, wherein the first pipeline stage comprises a first comparator configured to compare the analog input voltage to a first reference voltage, wherein the first pipeline stage is configured to generate the first digital stage output based in part on a comparison result of the first comparator;
a back-end analog-to-digital converter configured to generate a second digital stage output based on the analog residual voltage; and
a digital combining circuit configured to generate the first digital channel output based on combining the first digital stage output and the second digital stage output;
a second channel connected in parallel with the first channel, wherein the second channel is configured to receive the analog input voltage and to generate a second digital channel output,
wherein during a calibration cycle the pipeline analog-to-digital converter is configured to (i) identify an output code of the second digital channel output corresponding to a voltage level of the analog input voltage that is within a transition band of the first comparator of the first pipeline stage of the first channel, (ii) observe a code of the first digital stage output and a code of the second digital stage output of the first channel for each of a plurality of time instances in which the second digital channel output has the identified output code, and (iii) determine a transition step size of the first pipeline stage of the first channel based on the observed codes of the first digital stage output and the observed codes of the second digital stage output.

16. The pipeline analog-to-digital converter of claim 15, wherein the first pipeline stage further comprises a second comparator configured to compare the analog input voltage to a second reference voltage, wherein the first pipeline stage is configured to control the first digital stage output to a first code when the analog input voltage is less than the first reference voltage, to control the first digital stage output to a second code when the analog input voltage is greater than the second reference voltage, and to otherwise control the first digital stage output to a third code.

17. The pipeline analog-to-digital converter of claim 15, wherein the first pipeline stage is configured to generate the analog residual voltage based on adjusting the analog input voltage by a voltage amount that depends on a code of the first digital stage output.

18. The pipeline analog-to-digital converter of claim 15, wherein the digital combining circuit is configured to generate the first digital channel output based in part on determining a weight of the first digital stage output relative to the second digital stage output based on the transition step size.

19. The pipeline analog-to-digital converter of claim 15, further comprising a third channel connected in parallel with the first channel and the second channel, wherein the third channel is configured to receive the analog input voltage and to generate a third digital channel output.

20. The pipeline analog-to-digital converter of claim 15, wherein the first pipeline stage comprises a 1.5-bit stage.

\* \* \* \* \*